(12) United States Patent
Müller et al.

(10) Patent No.: US 12,433,071 B2
(45) Date of Patent: Sep. 30, 2025

(54) METHOD FOR PRODUCING AN OPTOELECTRONIC COMPONENT AND OPTOELECTRONIC COMPONENT

(71) Applicants: OSRAM Opto Semiconductors GmbH, Regensburg (DE); Fraunhofer-Gesellschaft zur Förderung der angewandten Forschung e. V., Munich (DE)

(72) Inventors: Vesna Müller, Vaterstetten (DE); David O'Brien, Portland, OR (US); Gerhard Domann, Würzburg (DE); Peer Löbmann, Würzburg (DE)

(73) Assignees: OSRAM Opto Semiconductors GmbH, Regensburg (DE); Fraunhofer-Gesellschaft zur Förderung der angewandten Forschung e. V., Munich (DE)

(*) Notice: Subject to any disclaimer, the term of this patent is extended or adjusted under 35 U.S.C. 154(b) by 989 days.

(21) Appl. No.: 17/611,502

(22) PCT Filed: Apr. 15, 2020

(86) PCT No.: PCT/EP2020/060599
§ 371 (c)(1),
(2) Date: Nov. 15, 2021

(87) PCT Pub. No.: WO2020/229078
PCT Pub. Date: Nov. 19, 2020

(65) Prior Publication Data
US 2022/0209073 A1     Jun. 30, 2022

(30) Foreign Application Priority Data
May 16, 2019   (DE) .................. 10 2019 112 955.9

(51) Int. Cl.
*H10H 20/84*    (2025.01)
*C09D 183/04*   (2006.01)
(Continued)

(52) U.S. Cl.
CPC .......... *H10H 20/84* (2025.01); *C09D 183/04* (2013.01); *H10H 20/01* (2025.01);
(Continued)

(58) Field of Classification Search
CPC ..... H01L 33/44; H01L 33/005; H01L 33/502; H01L 2933/0025; H01L 2933/0041;
(Continued)

(56) References Cited

U.S. PATENT DOCUMENTS

2005/0107478 A1    5/2005   Klimov et al.
2009/0246674 A1*  10/2009   Carlini ................ G03G 9/0926
                                                       430/110.2
(Continued)

FOREIGN PATENT DOCUMENTS

DE    102017104127 A1    8/2018
EP        1791795 A2     6/2007
(Continued)

OTHER PUBLICATIONS

Gerhard Jonschker, "Synerese und Relaxationsverhalten von Sol-Gel-Materialien," Thesis, Universität Saarbrücken 1998, pp. 34-36, 94-170, 196-201, 227-235, 245-251. (Abstract Provided).
(Continued)

*Primary Examiner* — Jonathan Han
(74) *Attorney, Agent, or Firm* — ArentFox Schiff LLP

(57) ABSTRACT

A method for producing an optoelectronic component is described with the steps of providing monomeric structural units, providing nanoparticles in a liquid medium, mixing the monomeric structural units and the nanoparticles in the liquid medium so that a starting sol is formed, introducing an acid into the starting sol to adjust a pH value, at least partial condensation of the monomeric structural units to (Continued)

Figure 1:
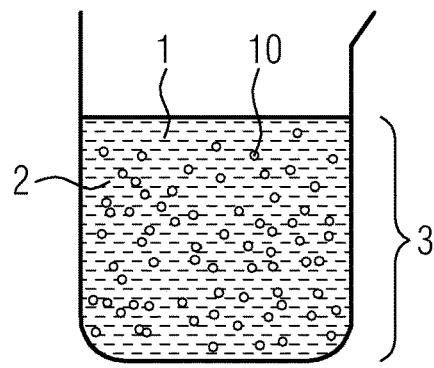

form a network, wherein the nanoparticles are at least partially covalently bonded to the network, so that a sol-gel material is formed, applying the sol-gel material to a semiconductor chip, curing the sol-gel material to form a coating material. Furthermore, an optoelectronic component is specified.

19 Claims, 4 Drawing Sheets

(51) Int. Cl.
*H10H 20/01* (2025.01)
*H10H 20/851* (2025.01)

(52) U.S. Cl.
CPC ....... *H10H 20/8512* (2025.01); *H10H 20/034* (2025.01); *H10H 20/0361* (2025.01)

(58) Field of Classification Search
CPC ............ H01L 33/58; H01L 2933/0091; C09D 183/04; H10H 20/84; H10H 20/01; H10H 20/8512; H10H 20/034; H10H 20/0361; H10H 20/855; H10H 20/882
See application file for complete search history.

(56) References Cited

U.S. PATENT DOCUMENTS

| | | | |
|---|---|---|---|
| 2010/0044640 A1 | 2/2010 | Agrawal et al. | |
| 2010/0291374 A1* | 11/2010 | Akarsu | G02B 5/02 428/328 |
| 2018/0252855 A1* | 9/2018 | De Boer | H01L 33/505 |

FOREIGN PATENT DOCUMENTS

| | | |
|---|---|---|
| WO | 2006030369 A2 | 3/2006 |
| WO | 2017054937 A1 | 4/2017 |

OTHER PUBLICATIONS

Gerhard Jonschker, "Synerese und Relaxationsverhalten von Sol-Gel-Materialien," Thesis, Universität Saarbrücken 1998, pp. 34-36, 94-170, 196-201, 227-235, 245-251.

International Search Report and Written Opinion issued in International Patent Application No. PCT/EP2020/060599 on Jun. 26, 2020.

* cited by examiner

METHOD FOR PRODUCING AN OPTOELECTRONIC COMPONENT AND OPTOELECTRONIC COMPONENT

This application is a 35 U.S.C. § 371 National Phase of PCT Application No. PCT/EP2020/060599, filed Apr. 15, 2020, which claims priority to German Application No. 10 2019 112 955.9, filed May 16, 2019, the disclosures of which are hereby incorporated by reference herein in their entireties.

A method for producing an optoelectronic component is specified. Furthermore, an optoelectronic component is specified.

An object to be solved is to specify a method for producing an optoelectronic component with improved properties. In addition, an optoelectronic component with improved properties is to be specified.

These objects are solved by a method for producing an optoelectronic component with the features of patent claim 1 and by an optoelectronic component with the features of patent claim 14.

Advantageous embodiments of the method for producing an optoelectronic component and of the optoelectronic component are the subject of the respective dependent claims.

According to one embodiment of the method for producing an optoelectronic component, monomeric structural units are provided. The monomeric structural units may be liquid or in powder form. Further, the monomeric structural units may be introduced into a solvent.

According to a further embodiment of the method, nanoparticles are provided in a liquid medium. The nanoparticles preferably comprise a diameter of at least 5 nanometers to at most 100 nanometers. The liquid medium is preferably a medium in which the nanoparticles are finely dispersed. For example, the nanoparticles are present as small solids or in a system of clusters.

According to at least one embodiment of the method, the nanoparticles in the liquid medium comprise a homogeneous composition. In particular, the nanoparticles in the liquid medium preferably comprise no functionalizations.

Furthermore, preferably no layers, for example organic layers, are arranged around the nanoparticles in the liquid medium. Preferably, only the surface of the nanoparticles in the liquid medium is surrounded by a passivation layer. That is, OH groups and/or O⁻ ions are arranged around the nanoparticles in the liquid medium.

According to another embodiment of the method, the monomeric structural units and the nanoparticles are mixed in the liquid medium so that a starting sol is formed. In the starting sol, the nanoparticles are preferably surrounded by the monomeric structural units. Particularly preferably, the nanoparticles are homogeneously distributed in the starting sol.

According to a further embodiment of the method, an acid is introduced into the starting sol to adjust a pH value. Preferably, the acid is added after the monomeric structural units are mixed with the nanoparticles in the liquid medium. If the acid is added at an earlier stage, there is a risk that the nanoparticles may precipitate and not be able to participate in the subsequent reaction. For example, the acid comprises formic acid, hydrochloric acid, sulfuric acid, and/or acetic acid, or consists of any of these materials.

According to at least one embodiment of the method, the monomeric structural units at least partially condense to form a network, wherein the nanoparticles are at least partially covalently bonded to the network to form a sol-gel material. Preferably, the network is a three-dimensional network. Partial condensation to form the network begins, for example, when the monomeric structural units and the nanoparticles are added together in the liquid medium. The addition of the acid preferentially accelerates the condensation of the monomeric structural units to the network. The condensation may be a polycondensation.

Preferably, the monomeric structural units in the starting sol are not linked by chemical bonds, for example covalent bonds. During condensation, initiated by, for example, UV light, heat, and/or an acid, the monomeric structural units react with each other to form chemical bonds. For example, by adding the acid, the monomeric structural units are hydrolyzed and can thus form chemical bonds with each other. Condensation of the monomeric structural units leads to the network in which the monomeric structural units are at least partially condensed.

The covalent bond between the nanoparticles and the network is a form of chemical bonding and as such is responsible for the strong cohesion of atoms in molecularly constructed chemical compounds. The sol-gel material is preferably present in a gel-like form.

According to a further embodiment of the method, the sol-gel material is applied to a semiconductor chip. Preferably, the sol-gel material is configured to adhere to the semiconductor chip.

According to at least one embodiment of the method, the sol-gel material is cured such that a coating material is formed. Preferably, during curing, the liquid medium of the nanoparticles and/or a solvent, which is optionally added to the starting sol, and/or alcohols and/or water is removed. Preferably, the curing removes the liquid medium of the nanoparticles and/or the solvent, which is optionally added to the starting sol, and/or the alcohols and/or water to a large extent, for example 95% each.

Curing is preferably performed by heating. Thereby, the liquid medium, the solvent, the alcohols and/or water generally evaporate. At the same time, during curing, if not already done by this time, the sol-gel material is almost completely condensed, for example up to 99%. Due to the evaporation and due to the almost complete condensation of the sol-gel material, a hard material is formed during the curing, which forms the coating material.

Preferably, the nanoparticles are suitable for adjusting the refractive index of the coating material. Particularly preferably, the refractive index of the coating material is increased. An increased refractive index is advantageous for a better outcoupling of an electromagnetic radiation out of the semiconductor chip.

According to a preferred embodiment of the method, monomeric structural units and nanoparticles are provided in a liquid medium. In a further step, the monomeric structural units and the nanoparticles are mixed in the liquid medium such that a starting sol is formed. An acid is introduced into the starting sol to adjust a pH. The monomeric structural units at least partially condense into a network, wherein the nanoparticles are at least partially covalently bonded to the network such that a sol-gel material is formed. The sol-gel material is applied to a semiconductor chip and subsequently cured such that a coating material is formed.

According to a preferred embodiment of the method for producing an optoelectronic component, the monomeric structural units comprise a monomeric structural unit A of the following general formula:

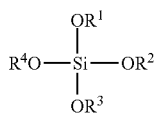

wherein the substituents $R^1$ to $R^4$ are each independently selected from the group formed by the alkyls and phenyls.

The alkyl substituents preferably comprise a hydrocarbon residue $C_1$ to $C_4$. Particularly preferably, the alkyl substituents are selected from the following group: methyl, ethyl, propyl, isopropyl, butyl, tert-butyl. Furthermore, the alkyl and the phenyl substituents may be substituted or unsubstituted. For example, the monomeric structural unit A comprises tetraethyl orthosilicate (TEOS) and/or tetramethyl orthosilicate (TMOS). In particular, combinations of different monomeric structural units of the monomeric structural unit A can find use in the optoelectronic component.

According to at least one embodiment of the method, the monomeric structural units comprise a monomeric structural unit B of the following general formula:

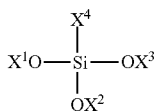

wherein the substituents $X^1$ to $X^4$ are each independently selected from the group consisting of alkyls and phenyls. The alkyl substituents preferably comprise a hydrocarbon residue $C_1$ to $C_4$. Particularly preferably, the alkyl substituents are selected from the following group: methyl, ethyl, propyl, isopropyl, butyl, tert-butyl. For example, the monomeric structural unit B comprises trimetoxymethylsilane (MTMOS), trietoxymethylsilane (MTEOS), trimetoxyethylsilane, ethyltrietoxysilane, ethyltriisopropoxysilane, and combinations thereof. Further, the alkyl substituents and the phenyl substituents may be substituted or unsubstituted.

According to a further embodiment of the method, the monomeric structural units comprise, in addition to the monomeric structural unit A, the monomeric structural unit B, which is different from the monomeric structural unit A. Preferably, the monomeric structural units comprise or consist of tetraethyl orthosilicate TEOS, as monomeric structural unit A, in combination with trietoxymethylsilane MTEOS, as monomeric structural unit B. The proportion of monomeric structural units B, for example trietoxymethylsilane, in the monomeric structural units is between at least 1 mol % and at most 80 mol %. Here, the proportion of monomeric structural unit A in the monomeric structural units is preferably between at least 20 mol % and at most 99 mol %.

Preferably, the molar ratio of the monomeric structural units TEOS to MTEOS can be between 20 to 80 and 80 to 20. The less MTEOS is contained in the coating material, the lower the probability of yellowing of the optoelectronic component during operation.

The addition of the monomeric structural unit B, preferably MTEOS, to the monomeric structural unit A in combination with the nanoparticles leads to a stabilization of the coating material, due to the organic residues of the monomeric structural unit B. The monomeric structural unit B preferably forms a polysiloxane in the cured coating material, which comprises an alkyl group $X^4$ at the silicon atom. The alkyl group $X^4$ is preferably a methyl group. The alkyl group on the silicon atom preferably modifies the network to form crack-resistant films when cured to the coating material. That is, the monomeric structural unit B in combination with the monomeric structural unit A and the nanoparticles preferably results in a coating material that is less susceptible to cracking. Furthermore, the coating material is preferably made flexible by the organic residues of the monomeric structural units.

According to a further embodiment of the method, the monomeric structural units comprise, in addition to the monomeric structural units A and B, the monomeric structural units of the general formulae $R^4{}_2$—$Si(OR)_2$ and/or $R^4{}_3$—$Si(OR)$. Here, R corresponds, for example, to the substituents $R^1$, $R^2$ or $R^3$. The substituents $R^1$, $R^2$, $R^3$ and $R^4$ are each independently selected from the group shown for the monomeric structural unit A.

According to at least one embodiment of the method, the coating material comprises a silicate. Silicates are generally chemical compounds of silicon and oxygen atoms. The basic building block of all silicates is usually $SiO_4$ tetrahedra. In the $SiO_4$ tetrahedron, the silicon atom is preferably surrounded by four oxygen atoms. Presently, the coating material preferably comprises a silicate which comprises subunits of the monomeric structural units A and B. That is, the silicate preferably comprises a small amount of organic residues. To form the silicate of the coating material, the monomeric structural units A condense with the monomeric structural units B. The percentage of the two monomeric structural units is preferably between at least 20 mol % and at most 99 mol % in the case of the monomeric structural unit A and between at least 1 mol % and at most 80 mol % in the case of the monomeric structural unit B.

According to at least one preferred embodiment of the method, the coating material comprises a polysiloxane bridged to a network via Si—O—Si units. The Si—O—Si units are generally formed by condensation of the monomeric structural units A and B. The polysiloxane is usually a macromolecular organosilicon compound comprising the structural unit —$Si(R_2O)$—. Preferably, R is a methyl group. Particularly preferably, exactly one R is a methyl group. Furthermore, R can be an oxygen atom, with which in turn a further structural unit —$Si(R_2O)$— is linked.

In the coating material, the individual monomeric structural units are preferably linked to each other via Si—O—Si units and preferably form strands of Si—O—Si units strung together. A plurality of strands of contiguous Si—O—Si units are preferably linked to each other via oxygen atoms. In particular, the coating material preferably comprises a polysiloxane with a small number of organic groups. Preferably, only a small number of methyl groups are present in the coating material. The percentage of the two monomeric structural units leading to the formation of the coating material is preferably between at least 20 mol % and at most 99 mol % for the monomeric structural unit A and between at least 1 mol % and at most 80 mol % for the monomeric structural unit B.

According to at least one preferred embodiment of the method, the nanoparticles comprise or consist of $SiO_2$, $ZrO_2$, and/or $TiO_2$ and are covalently bonded to the polysiloxane.

According to at least one embodiment of the method, the coating material comprises a polysiloxane bridged to the network via Si—O—Si units and in which the nanoparticles comprise $SiO_2$, $ZrO_2$ and/or $TiO_2$ or consist of $SiO_2$, $ZrO_2$ and/or $TiO_2$ and are covalently bonded to the polysiloxane. The coating material is present in a cured state compared to the sol-gel material. That is, the coating material is almost completely condensed and does not comprise a liquid portion, such as solvent or the liquid medium, whereas the sol-gel material is present partially condensed with the liquid portion.

The nanoparticles are preferably configured to adjust the refractive index of the coating material. Particularly preferably, the refractive index of the coating material is increased by the nanoparticles.

According to at least one embodiment of the method, the $SiO_2$, $ZrO_2$ and/or $TiO_2$ nanoparticle is bonded to the network via Si, Zr, Ti—O units. Here, preferably, a reaction of the oxygen atom of the $SiO_2$, $ZrO_2$ and/or $TiO_2$ nanoparticle in the liquid medium takes place, by the addition of the acid, with the silicon atom of the network and/or to the monomeric structural units to form the covalent bond. In this process, an alcohol and water are preferably split off. The alcohol split off is preferably methanol and/or ethanol. This depends on the monomeric structural units.

According to a preferred embodiment of the method, the nanoparticles in the liquid medium comprise between at least 5 mol % and at most 80 mol %. Preferably, the nanoparticles in the liquid medium comprise between at least 5 mol % and at most 60 mol %. The liquid medium here is preferably water. The $SiO_2$, $ZrO_2$ and/or $TiO_2$ nanoparticles comprise a particle size of 5 nanometers to 100 nanometers. The $SiO_2$, $ZrO_2$ and/or $TiO_2$ nanoparticles, in the liquid medium, are preferably present in the form of free and finely distributed individual particles. The $SiO_2$, $ZrO_2$ and/or $TiO_2$ nanoparticles, in the liquid medium, are preferably stabilized by surface charges generated via the pH value. The nanoparticles in the liquid medium preferably comprise a high density and a low segregation tendency.

According to a preferred embodiment of the method, the nanoparticles in the liquid medium comprise between at least 25 mol % and at most 35 mol %.

According to a further embodiment of the method, the acid for adjusting the pH value is hydrochloric acid.

According to a preferred embodiment of the method, the pH value is adjusted with the acid to less than or equal to 5. Preferably, the pH value of the starting sol is adjusted to less than or equal to 3. Particularly preferably, the pH value of the starting sol is adjusted to less than or equal to 2. A low pH value is advantageous because the monomeric structural units can then be hydrolyzed particularly rapidly. The rapid hydrolysis leads to rapid condensation to the network.

According to at least one embodiment of the method, the sol-gel material is applied to the semiconductor chip by means of spin coating, spray coating, doctor blading and/or ink jetting. The sol-gel material is preferably applied to the surface of the semiconductor chip, to the semiconductor chip in a package or to a semiconductor chip wafer.

According to a preferred embodiment of the method, the sol-gel material is cured by heating at a temperature between 70° C. and 300° C., both inclusive. The curing results in the formation of a coating material. During this process, the liquid medium, the volatile alcohol formed and water are preferably removed. Likewise, curing preferably results in near complete condensation. The near complete condensation, which additionally leads to the curing, is accelerated by high temperatures. More than 95 mol % of the monomeric structural units are condensed to the network. The sol-gel material is further preferably thermally stable up to a temperature of 300° C.

According to at least one embodiment of the method, after adjusting the pH value, inorganic phosphor particles are introduced into the starting sol. The inorganic phosphor particles are preferably mixed and homogenized with the starting sol.

According to a preferred embodiment of the method, the phosphor particles comprise a ceramic phosphor and/or a quantum dot phosphor. Preferably, the ceramic phosphor particles comprise a garnet-type phosphor. Particularly preferably, the garnet-typhe phosphor is a YAG phosphor with the chemical formula $Y_3Al_5O_{12}:Ce^{3+}$.

Furthermore, the ceramic phosphor particles may also comprise a nitride phosphor. Particularly preferably, the nitride phosphor is a SCASN phosphor with the chemical formula $(Ba,Sr,Ca)AlSiN_3:Eu$. Additionally or alternatively, the phosphor particles may comprise an oxynitride-based phosphor. For example, the combination of several different phosphor particles is possible.

The method described herein is suitable for providing an optoelectronic component, which will be described in more detail below. Features and embodiments merely described in connection with the method may also be adapted in the optoelectronic component and vice versa.

According to one embodiment, the optoelectronic component comprises a semiconductor chip that emits electromagnetic radiation of a first wavelength range during operation. Preferably, the semiconductor chip emits the electromagnetic radiation of a first wavelength range from a radiation exit surface. Preferably, the semiconductor chip emits electromagnetic radiation from the ultraviolet spectral range and/or from the visible spectral range, particularly preferably from the blue spectral range, during operation.

The semiconductor chip is, for example, a light-emitting diode chip or a laser diode chip. Preferably, the semiconductor chip comprises an epitaxially grown semiconductor layer sequence with an active zone suitable for generating electromagnetic radiation. For this purpose, the active zone comprises, for example, a pn junction, a double heterostructure, a single quantum well structure or, particularly preferably, a multiple quantum well structure.

According to a further embodiment, the optoelectronic component comprises a coating material manufactured with the method described herein.

According to another embodiment, the optoelectronic component comprises a coating material comprising nanoparticles and a polysiloxane bridged to the network via Si—O—Si units. The nanoparticles preferably comprise $SiO_2$, $ZrO_2$ and/or $TiO_2$ and are covalently bonded to the polysiloxane. In particular, the nanoparticles are bonded to the polysiloxane via a nanoparticle-O—Si unit.

According to a preferred embodiment, the optoelectronic component comprises a semiconductor chip that emits electromagnetic radiation of a first wavelength range during operation, and a coating material comprising nanoparticles and a polysiloxane bridged to the network via Si—O—Si units. The nanoparticles preferably comprise $SiO_2$, $ZrO_2$, and/or $TiO_2$ and are covalently bonded to the polysiloxane.

According to a preferred embodiment, the optoelectronic component comprises a semiconductor chip that emits electromagnetic radiation of a first wavelength range during operation, and a coating material applied with a method described herein.

The coating material is intended to encase the semiconductor chip and thus protect it from external mechanical and/or chemical influences. Furthermore, the coating material preferably resists detachment, for example by means of mechanical force, at least within certain limits. This means, for example, that during further processing of the semiconductor chip coated with the coating material, the layer does not come off. The coating material is preferably adapted to be transparent to electromagnetic radiation from the semiconductor chip, in particular visible light. This means that more than 95% of the electromagnetic radiation of the semiconductor chip passes through the coating material.

Alternatively or additionally, the coating material can serve as a matrix material for phosphor particles. In this case, the coating material preferably completely encases the phosphor particles. That is, the phosphor particles are preferably embedded in the matrix material. The matrix material is preferably configured to absorb the electromagnetic radiation of the first wavelength range of the semiconductor chip and to convert it into electromagnetic radiation of a second wavelength range.

According to a preferred embodiment, the optoelectronic component comprises the coating material fabricated with a method described herein.

According to a preferred embodiment of the optoelectronic component, phosphor particles, which convert the electromagnetic radiation of the first wavelength range into electromagnetic radiation of a second wavelength range, are embedded in the coating material. The electromagnetic radiation of the second wavelength range is preferably different from the first wavelength range.

The phosphor particles embedded in the coating material preferably impart wavelength-converting properties to the coating material. For example, the coating material with the phosphor particles only partially converts the electromagnetic radiation of the semiconductor chip into electromagnetic radiation of the second wavelength range, while another part of the electromagnetic radiation of the semiconductor chip is transmitted by the coating material with the phosphor particles. In this case, the optoelectronic component preferably emits mixed light composed of electromagnetic radiation of the first wavelength range and electromagnetic radiation of the second wavelength range. For example, the optoelectronic component emits white light.

According to at least one embodiment of the optoelectronic component, the coating material comprises a thickness of at least 1 micrometer.

According to at least one embodiment of the optoelectronic component, the coating material comprises a thickness of at least 5 micrometers.

According to a preferred embodiment of the optoelectronic component, the coating material is adapted as a layer on the radiation exit surface of the semiconductor chip. The layer preferably comprises a thickness of at least 1 micrometer, preferably of at least 5 micrometers. The layer is preferably adapted to be low in pores and cracks.

One idea of the present optoelectronic component is to provide a coating material comprising nanoparticles linked with a network of monomeric structural units. In this regard, the optoelectronic component comprises improved adhesion to the semiconductor chip due to the reduced amount of organic materials compared to conventional polysiloxanes and conventional silicates. In addition, with the optoelectronic component described herein, thermal stability at temperatures lower than 300° C. and light stability to blue light are achieved. The coating material can thus find application in high-power LEDs, where conventional polysiloxanes and conventional silicates typically exhibit decomposition. Similarly, a thicker layer of the coating material can be obtained with a low tendency to crack, which is additionally low in pores. Furthermore, the nanoparticles can be used to adjust the refractive index of the coating material with advantage.

In addition, an undesirable yellowing of the coating material due to UV radiation is prevented or at least inhibited by introducing nanoparticles into the coating material.

Further advantageous embodiments and further embodiments of the optoelectronic component and the method result from the exemplary embodiment described below in conjunction with the figures.

Figure 4:
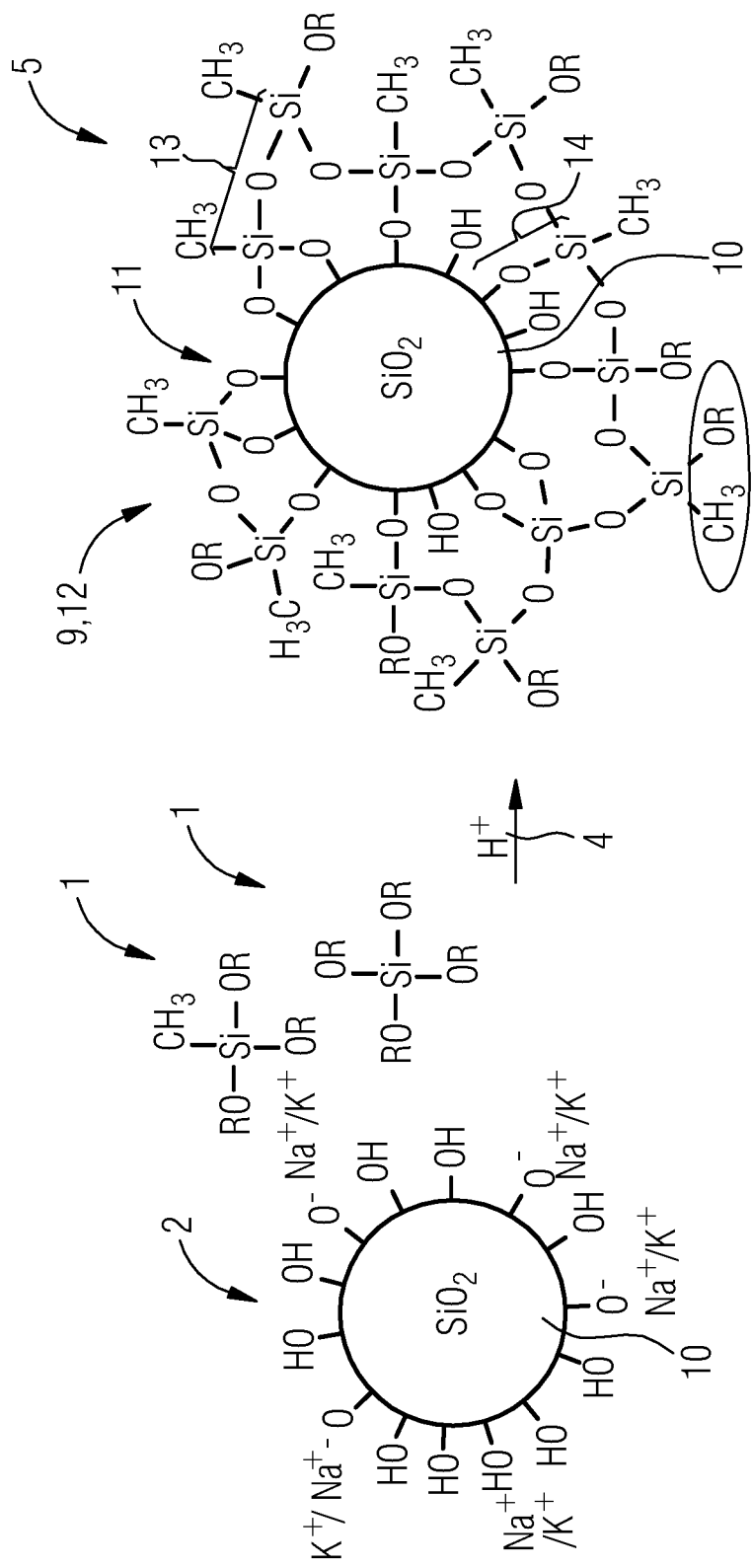
Figure 5:
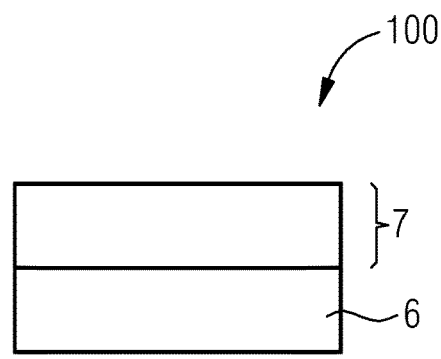
Figure 6:
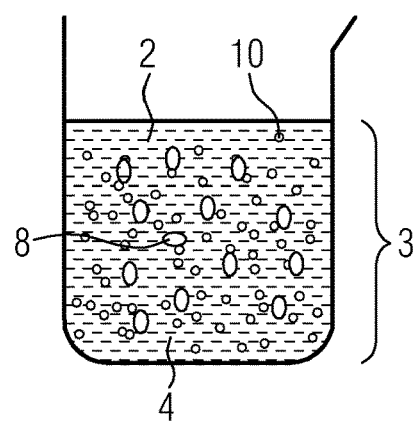
Figure 7:
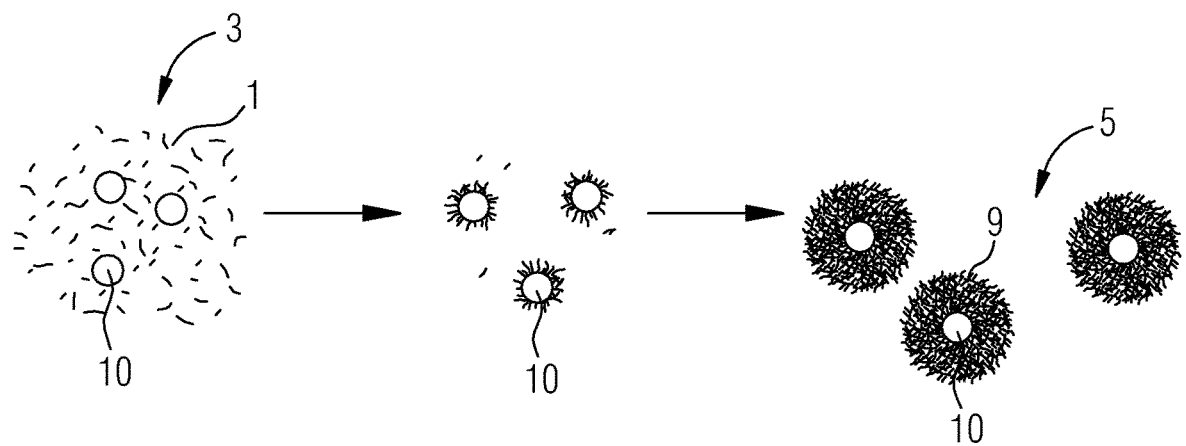
Figure 8:
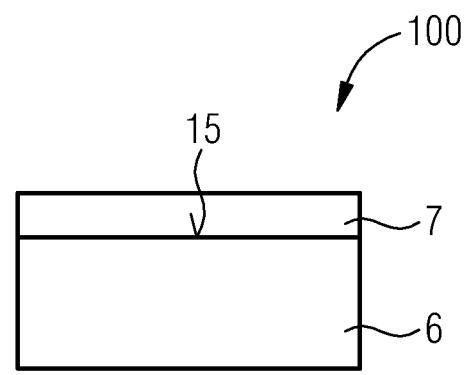

It shows:

FIGS. 1, 2, 3, 4 and 5 each schematic representations of different stages of a method for producing an optoelectronic component according to an exemplary embodiment, FIG. 6 a schematic representation of a stage of a method for producing an optoelectronic component according to an exemplary embodiment, FIG. 7 a schematic sectional view of a sol-gel material according to an exemplary embodiment, and FIG. 8 a schematic sectional view of an optoelectronic component according to an exemplary embodiment.

Elements that are identical, similar or have the same effect are marked with the same reference signs in the figures. The figures and the proportions of the elements shown in the figures are not to be regarded as true to scale. Rather, individual elements, in particular layer thicknesses, may be shown exaggeratedly large for better representability and/or for better understanding.

In the method according to the exemplary embodiment of FIGS. 1 to 5, monomeric structural units 1 and nanoparticles 10 are provided in a liquid medium 2 in a first method step. The liquid medium 2 in this case is water. The monomeric structural units 1 and the nanoparticles 10 in the liquid medium 2 are mixed for about five minutes to form a starting sol 3 (FIG. 1).

The nanoparticles 10 in the liquid medium 2 comprise between 5 mol % and 80 mol % inclusive. The monomeric structural units 1 comprise a combination of at least one monomeric structural unit A and at least one monomeric structural unit B. The proportion of monomeric structural units B among the monomeric structural units is between at least 1 mol % and at most 80 mol %. Here, the proportion of monomeric structural unit A in the monomeric structural units is preferably between at least 20 mol % and at most 99 mol %.

Figure 2:
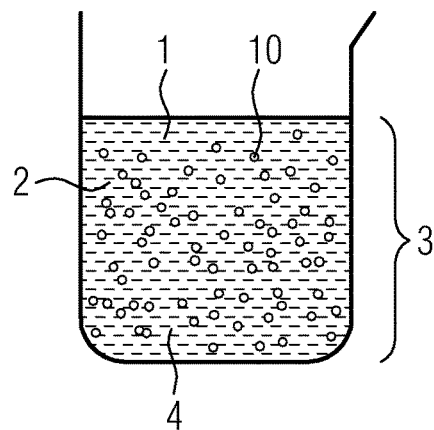

In a next method step, an acid 4 is added to the starting sol 3 to adjust a pH value (FIG. 2). This is done after the monomeric structural units 1 and the nanoparticles 10 are mixed in the liquid medium 2, since otherwise the nanoparticles 10 would precipitate and could no longer react with the monomeric structural units 1. Hydrochloric acid, for example, is used to adjust the pH value. The pH value of the starting sol 3 is adjusted to a pH value of less than or equal to 5.

Figure 3:
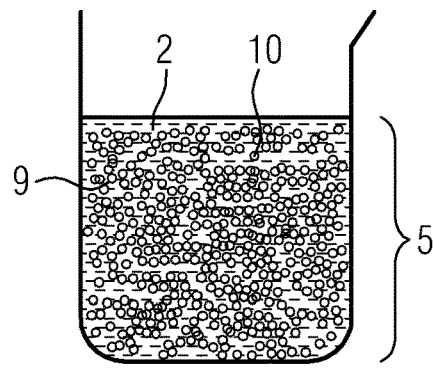

In a further method step, the monomeric structural units 1 are at least partially condensed to form a network 9 (FIG. 3). Furthermore, the nanoparticles 10 are at least partially covalently bonded to the network 9, so that a sol-gel material 5 is formed. Preferably, the network 9 is a three-dimensional network.

FIG. 4 first shows the monomeric structural units 1, present TEOS as monomeric structural unit A and MTEOS as monomeric structural unit B, and the nanoparticles 10 in the liquid medium 2. The nanoparticles 10 in the liquid medium 2 comprise $SiO_2$ nanoparticles 10. Alternatively, $ZrO_2$ and/or $TiO_2$ can also be used as material for the nanoparticles 10. The nanoparticles 10 comprise cations, for example sodium cations, potassium cations or protons. Acid 4 is added to the mixture of the nanoparticles 10 in the liquid medium 2 and the monomeric structural units 1. The monomeric structural units 1 partially condense to form the network 9, wherein the nanoparticles 10 are at least partially covalently 11 bonded to the network 9 to form a sol-gel material 5. The network 9 is formed by the monomeric structural units 1 being partially hydrolyzed by the addition of the acid 4 and then condensing to the network 9 via a condensation reaction. That is, the monomeric structural units 1, TEOS and MTEOS, are linked via Si—O—Si units 13. Similarly, a larger network 9 can be formed by bridging additional Si—O—Si units 13.

Furthermore, the network 9 forms the covalent bond 11 with the SiO$_2$ nanoparticle 10. That is, the oxygen atoms from the nanoparticle 10 in the liquid medium 2 react nucleophilically with the silicon atom of the network 9 and/or with the monomeric structural units 1 that have not yet been condensed to date. This produces alcohols, such as methanol and/or ethanol, and water. The SiO$_2$ nanoparticles 10 are bonded to the network 9 via Si—O units 14. In the case of ZrO$_2$ nanoparticles, Zr—O units would be bonded to the network 9.

The sol-gel material 5 is applied to a semiconductor chip 6, for example by spin coating, spray coating, doctor blading and/or ink jetting. Subsequently, by heating at a temperature between 70° C. and 300° C. inclusive, the sol-gel material 5 is cured to form the coating material 7 (FIG. 5). Curing removes the liquid medium 2 as well as alcohols and water produced during condensation. Similarly, curing achieves almost complete condensation of the monomeric structural units 1. The cured sol-gel material 5 is referred to as the coating material 7.

In the method according to the exemplary embodiment of FIG. 6, the method steps of FIGS. 1 and 2 are first carried out. Following the method step of FIG. 2, in which the acid 4 is introduced into the starting sol 3, inorganic phosphor particles 8 are introduced into the starting sol 3. The inorganic phosphor particles 8 comprise a ceramic phosphor and/or a quantum dot phosphor. Preferably, the inorganic phosphor particles 8 comprise or consist of a garnet-type phosphor and/or a nitride phosphor and/or an oxynitride-based phosphor. After the inorganic phosphor particles 8 have been distributed as homogeneously as possible in the starting sol 3, the resulting sol-gel material 5 with phosphor particles 8 is applied to the semiconductor chip 6 and the method is followed as already described with reference to FIGS. 3 to 5.

FIG. 7 shows a schematic diagram of particle growth with SiO$_2$ nanoparticles 10 and monomeric structural units 1. The ratio of monomeric structural units A to monomeric structural units B here is A:B=1:4. That is, 20 mol % TEOS units and 80 mol % MTEOS units are used as monomeric structural units 1. The monomeric structural units 1 condense to form the network 9 and are thereby bonded to the SiO$_2$ nanoparticles 10. That is, the network 9 is grown on the surface of the SiO$_2$ nanoparticles. Compact particles with a diameter of at least 50 nanometers to at most 100 nanometers are formed.

The exemplary embodiment shown in FIG. 8 comprises an optoelectronic component 100 comprising a semiconductor chip 6, which in operation emits electromagnetic radiation of a first wavelength range, and a coating material 7. The coating material 7 is manufactured according to a method described herein. Here, the coating material 7 is adapted as a layer on a radiation emitting surface 15 of the semiconductor chip 6. Furthermore, phosphor particles 8 may be embedded in the coating material 7 to convert electromagnetic radiation of the first wavelength range into electromagnetic radiation of a second wavelength range.

The invention is not limited to the exemplary embodiments by the description thereof. Rather, the invention encompasses any new feature as well as any combination of features, which particularly includes any combination of features in the patent claims, even if that feature or combination itself is not explicitly specified in the patent claims or exemplary embodiments.

This patent application claims priority to German patent application DE 10 2019 112 955.9, the disclosure content of which is hereby incorporated by reference.

LIST OF REFERENCE SIGNS

100 optoelectronic component
1 monomeric structural unit
2 liquid medium
3 starting sol
4 acid
5 sol-gel material
6 semiconductor chip
7 coating material
8 phosphor particle
9 network
10 nanoparticle
11 covalent bond
12 polysiloxane
13 Si—O—Si unit
14 Si—O unit
15 radiation exit surface
16 common coating

The invention claimed is:

1. Method for producing an optoelectronic component with the steps
   providing monomeric structural units,
   providing nanoparticles in a liquid medium,
   mixing the monomeric structural units and the nanoparticles in the liquid medium so that a starting sol is formed,
   introducing an acid into the starting sol to adjust a pH value,
   at least partial condensation of the monomeric structural units to form a network, wherein the nanoparticles are at least partially covalently bonded to the network, so that a sol-gel material is formed,
   applying the sol-gel material to a semiconductor chip,
   curing the sol-gel material so that a coating material is formed.

2. Method according to claim 1, wherein the monomeric structural units comprises a monomeric structural unit A of the following general formula:

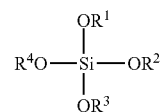

wherein the substituents $R^1$ to $R^4$ are each independently selected from the group formed by the alkyls and phenyls.

3. Method according to claim 1,
   wherein the monomeric structural units comprises a monomeric structural unit B of the following general formula:

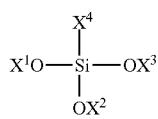

wherein the substituents $X^1$ to $X^4$ are each independently selected from the group consisting of the alkyls and phenyls.

4. Method according to claim 1, wherein the coating material comprises a silicate.

5. Method according to claim 1, in which
the coating material comprises a polysiloxane bridged to the network via Si—O—Si units, and
the nanoparticles comprise $SiO_2$, $ZrO_2$ and/or $TiO_2$ and are covalently bonded to the polysiloxane.

6. Method according to claim 5, wherein the $SiO_2$, $ZrO_2$ and/or $TiO_2$ nanoparticle is bonded to the network via Si/Zr/Ti—O units.

7. Method according to claim 1, wherein the nanoparticles in the liquid medium comprise between 5 mol % and 80 mol %, both inclusive.

8. Method according to claim 1, wherein the acid for adjusting the pH value is hydrochloric acid.

9. Method according to claim 1, wherein the pH value is adjusted to less than or equal to 5 with the acid.

10. Method according to claim 1, wherein the sol-gel material is applied to the semiconductor chip by spin coating, spray coating, doctor blading and/or ink jetting.

11. Method according to claim 1, wherein the sol-gel material is cured by heating at a temperature between 70° C. and 300° C., both inclusive.

12. Method according to claim 1, wherein after adjusting the pH value, inorganic phosphor particles are introduced into the starting sol.

13. Method according to claim 12, wherein the inorganic phosphor particles comprise a ceramic phosphor and/or a quantum dot phosphor.

14. Optoelectronic component with:
a semiconductor chip which emits electromagnetic radiation of a first wavelength range during operation, and
a coating material applied with a method according to claim 1.

15. Optoelectronic component according to claim 14, wherein phosphor particles, which convert the electromagnetic radiation of the first wavelength range into electromagnetic radiation of a second wavelength range, are embedded in the coating material.

16. Optoelectronic component according to claim 14, wherein the coating material is formed as a layer on a radiation exit surface of the semiconductor chip.

17. Method according to claim 1, wherein the acid is added after the monomeric structural units are mixed with the nanoparticles in the liquid medium.

18. Method according to claim 1, wherein the nanoparticles in the liquid medium comprise no functionalizations.

19. Method according to claim 1, wherein the liquid medium is water.

* * * * *